United States Patent [19]

Edmond et al.

[11] Patent Number: 5,381,103
[45] Date of Patent: Jan. 10, 1995

[54] SYSTEM AND METHOD FOR ACCELERATED DEGRADATION TESTING OF SEMICONDUCTOR DEVICES

[75] Inventors: John A. Edmond, Apex; Douglas A. Asbury, Chapel Hill; Calvin H. Carter, Jr., Cary; Douglas G. Waltz, Durham, all of N.C.

[73] Assignee: Cree Research, Inc., Durham, N.C.

[21] Appl. No.: 959,714

[22] Filed: Oct. 13, 1992

[51] Int. Cl.$^6$ ............................................. G01R 1/04
[52] U.S. Cl. ........................................ 324/753; 437/8
[58] Field of Search ............. 324/158 D, 753; 29/537; 437/8

[56] References Cited

U.S. PATENT DOCUMENTS

| | | | |
|---|---|---|---|
| 3,742,356 | 6/1973 | Brock | 324/158 D |
| 3,870,953 | 3/1975 | Boatman et al. | 324/158 T |
| 3,978,405 | 8/1976 | Petree | 324/158 |
| 4,215,309 | 7/1980 | Frey | 324/158 |
| 4,301,403 | 11/1981 | Hawkes et al. | 324/62 |
| 4,307,342 | 12/1981 | Peterson | 324/158 |
| 4,489,477 | 12/1984 | Chik et al. | 29/569 |
| 4,578,641 | 3/1986 | Tiedje | 324/158 |
| 4,611,116 | 9/1986 | Batt | 250/239 |
| 4,775,640 | 10/1988 | Chan | 437/8 |
| 4,797,609 | 1/1989 | Yang | 324/158 |
| 5,047,711 | 9/1991 | Smith et al. | 324/158 |
| 5,065,007 | 11/1991 | Tanaka | 250/215 |
| 5,303,905 | 7/1991 | Figal | 324/158 |

FOREIGN PATENT DOCUMENTS

0407029A2  5/1990  European Pat. Off.
57-133368  11/1982  Japan.

OTHER PUBLICATIONS

Light Emitting Diodes an Introduction, by Klaus Gillessen and Werner Schairer, Prentice/Hall International 1991, pp. 97–99.

Primary Examiner—Kenneth A. Wieder
Assistant Examiner—Barry C. Bowser
Attorney, Agent, or Firm—Bell, Seltzer, Park & Gibson

[57] ABSTRACT

A method of testing a semiconductor device, having the steps of pulsing the semiconductor device with a predetermined level of current for a duration of time so as to cause inadequate parts to degrade and to cause adequate parts to stabilize, and measuring predetermined electrical or optical performance characteristics for the semiconductor device after the current pulse. A system for testing a semiconductor device on a wafer is also provided having a contact probe for applying current pulses to the semiconductor device on the wafer, measuring means electrically connected to the probe for measuring predetermined electrical or optical performance characteristics of the semiconductor device on the wafer, and optical detection means electrically connected to the measuring means for detecting radiation emitted from the semiconductor device on the wafer.

39 Claims, 3 Drawing Sheets

SYSTEM AND METHOD FOR ACCELERATED DEGRADATION TESTING OF SEMICONDUCTOR DEVICES

FIELD OF THE INVENTION

This invention relates to the testing of semiconductor devices, and more particularly to accelerated degradation testing of such devices.

BACKGROUND OF THE INVENTION

Various methods have been used in the past to predict or test for the failure performance of semiconductor devices. Most manufacturers of such devices use these various methods to prevent weak devices from failing when used by the customer. The manufacturer desires good performance from the device in order to build device reliability, prevent returns, reduce service calls by the manufacturer, and prevent customer dissatisfaction.

A well known phenomenon typically associated with the life of semiconductor devices is known as "infant mortality." This term is used to describe the relatively high failure rate observed in new components. The initial high failure rate of components normally drops to a low value after a short period of operation, and continues to remain low for a relatively long period of time. In order to avoid the effects of "infant mortality" in semiconductor devices, it is common to "burn-in" such components until the period of infant mortality is past. This "burn-in" typically involves alternately passing a high forward current through the device, and applying a reverse bias voltage approximately equal to the rated peak inverse voltage or temperature changes in the device. Examples of these "burn-in" systems and methods may be seen in U.S. Pat. No. 5,047,711 by Smith et al. entitled "Wafer-Level Burn-In Testing of Integrated Circuits", U.S. Pat. No. 5,030,905 by Figal entitled "Below a Minute Burn-In", and U.S. Pat. No. 4,215,309 by Frey entitled "High Efficiency Switching Circuit."

"Burn-in" testing, however, fails to detect various problems associated with the semiconductor devices that may not be detected by the application of forward current alone and also problems that may occur when the device is beyond the initial high failure rate point in the degradation curve. As an example, high voltage surges often occur in electrical systems that expose the semiconductor devices to higher voltages than specified by the manufacturers. The instantaneous power surge that occurs typically determines the breakdown voltage wherein device failure occurs. The breakdown voltage may be tested for or predicted by a system or method such as seen in U.S. Pat. No. 4,307,342 by Peterson entitled "Method and Apparatus For Testing Electronic Devices."

Other testing systems and methods have been attempted for testing radiation being emitted from semiconductor devices such as light emitting diodes ("LEDs") or laser diodes. Some of these systems and methods may be seen in U.S. Pat. No. 4,578,641 by Tiedje entitled "Systems For Measuring Carrier Lifetime of Semiconductor Wafers", U.S. Pat. No. 4,797,609 by Yane entitled "LED Monitoring Without External Light Detection", U.S. Pat. No. 5,065,007 by Tanaka entitled "Apparatus For Measuring Light Output From Semiconductor Light Emitting Element", and U.S. Pat. No. 4,611,116 by Batt entitled "Light Emitting Diode Intensity Tester."

Also, testing systems and methods have been attempted where the semiconductor devices such as P-N junction diodes or bipolar transistors are pulsed with a high current surge to induce damage to the semiconductor junction of interest. Examples of these systems and methods may be seen in U.S. Pat. No. 3,978,405 by Petree entitled "Damage Thresholds Of P-N Junction Devices By A Current Pulse Method" and U.S. Pat. No. 4,301,403 by Hawkes et al. entitled "Electrical Circuit Testing."

Another known method of testing semiconductor devices is by statistical sampling a group or lot of devices developed from the same material and then projecting the performance of the entire group of devices based on the statistical sample. For example, in more mature LED material, such as GaAs, GaAsP, or AlGaAS, a wafer containing LED dice is typically scribed and sawn, and then statistically sampled. The LED samples are initially tested for various optical and electrical performance characteristics. Based on the degradation or other testing of the statistical LED samples, the entire wafer of LED dice is either accepted or rejected. A description of this technique for LED semiconductor devices may be seen in the book "Light Emitting Diodes: An Introduction" by K. Gillessen and W. Schairer, § 3-3-7 at 98–99 (1991). Although helpful for mature semiconductor material where performance is predictable, such statistical sampling fails to be a proper technique to select less mature semiconductor material such as silicon carbide (SIC).

Other techniques such as probing a wafer of semiconductor devices, such as LEDs, are also known. These techniques typically involve "wafer probers" which are instruments used to test the quality and yield of completely processed wafers. The prober puts a probe on the contact of a first device on the edge of a wafer and allows the user to perform various measurements. After the measurements on the first device have been finished, the prober moves the wafer a controlled distance to the next diode. The data obtained during a measurement cycle is then evaluated in an accept-reject manner and bad diodes marked by a dot of ink. A description of this technique may also be seen in the book "Light Emitting Diodes: An Introduction" by K. Gillessen and W. Schairer, § 3-3-6 at 97 (1991).

The wafer probing technique, however, like the statistical sampling, may be appropriate for some mature semiconductor materials, but may not always provide a method for measuring performance of less mature semiconductor material over time, thereby causing the customer dissatisfaction problems previously described. Also, the performance of devices manufactured with this less mature material may not be statistically predictable because of its relatively recent development. For example, the use of SiC for various semiconductor devices, including light emitting diodes, has only recently become a commercially viable alternative. Devices made from these materials may be seen in U.S. Pat. Nos. 4,918,497 and 5,027,168 by Edmond, one of the inventors of the present application, entitled "Blue Light Emitting Diode Formed In Silicon Carbide". Hence, these less mature materials require a different testing apparatus and method.

Therefore, there is still a need for an apparatus and method for testing semiconductor devices wherein performance is not statistically predictable for a group of devices and which predicts performance over time.

SUMMARY OF THE INVENTION

It is therefore an object of the present invention to provide a method of testing semiconductor devices by accelerating degradation of the semiconductor devices and measuring various performance characteristics.

This and other objects and advantages of the present invention are provided by an apparatus and method of current pulsing a semiconductor device with a high enough current so as to cause inadequate devices to degrade and adequate devices to stabilize and measuring optical and/or electrical performance characteristics before, during, and after the current pulse.

More particularly, the method of testing a semiconductor device has the steps of pulsing a semiconductor device with a predetermined amount of current for a duration of time so as to cause inadequate parts to degrade and to cause adequate parts to stabilize and measuring predetermined electrical or optical performance characteristics before, during, and/or after the current pulse.

The system for testing a semiconductor device on a wafer has a contact probe for applying current pulses to a semiconductor device on a wafer, measuring means electrically connected to the probes for measuring predetermined electrical or optical performance characteristics of the semiconductor device on the wafer, and optical detection means electrically connected to the measuring means for detecting radiation emitted from the semiconductor device on the wafer.

BRIEF DESCRIPTION OF THE DRAWINGS

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein.

DESCRIPTION OF A EMBODIMENT

The present invention now will be described more fully hereinafter with reference to the accompanying drawings in which a preferred embodiment of the invention is shown. Like numbers refer to like elements throughout.

Figure 1:
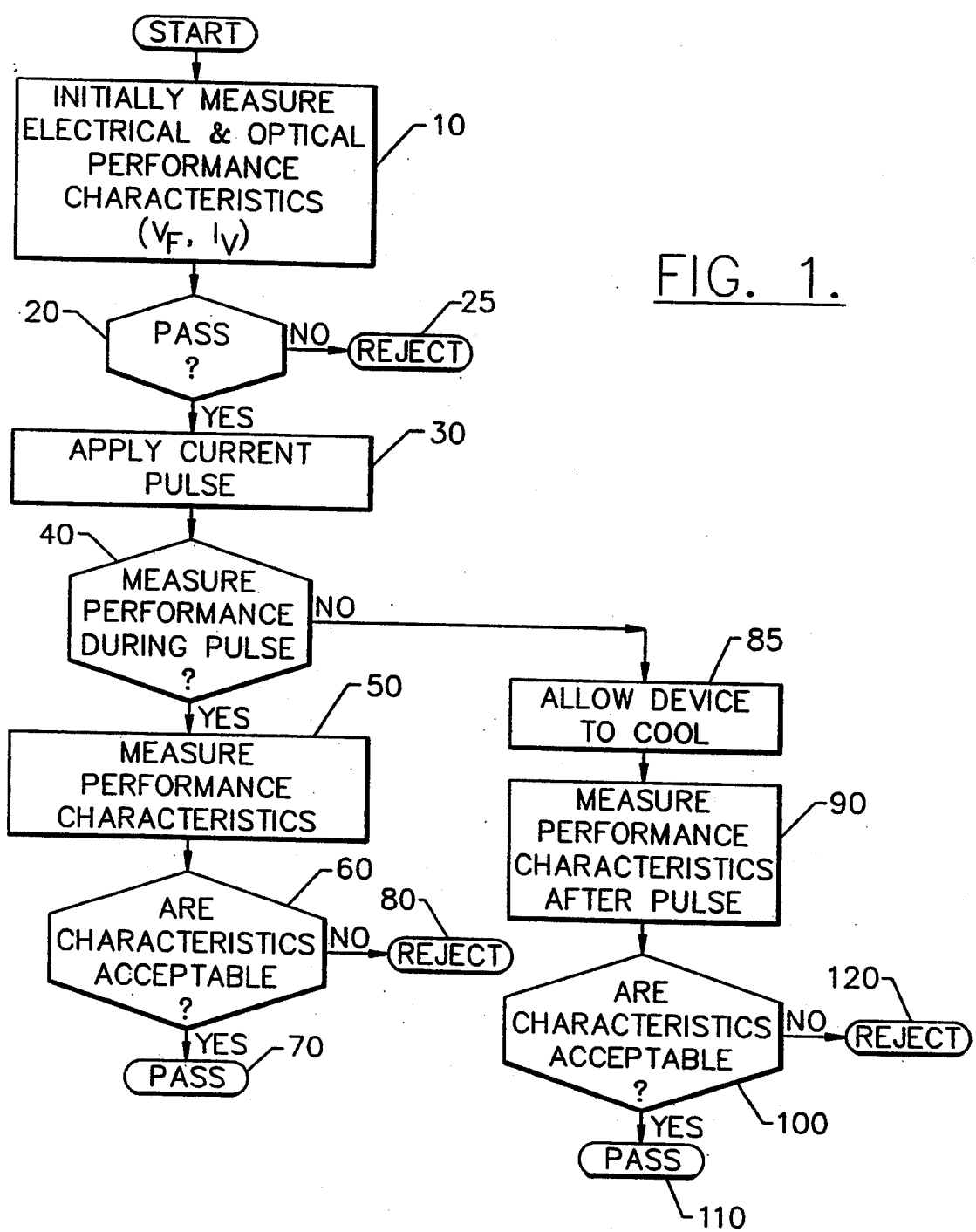
FIG. 1 schematically illustrates the method of testing semiconductor devices according to the present invention.

FIG. 1 illustrates a schematic diagram of the method of testing semiconductor devices such as LEDs according to the present invention. As illustrated in block 10, a device under test is initially measured for predetermined electrical or optical performance characteristics such as forward voltage ($V_F$), light intensity, and color hue. If a device passes the initial measurement test as illustrated in block 20, the device is further analyzed. If the device fails the initial measurement test, then the testing of the device is terminated and the device rejected, as illustrated in block 25. After initially measuring the device performance characteristics and determining that the device is acceptable, a current pulse, as illustrated in block 30, is applied to the device for a predetermined time period in order to cause an inadequate device to degrade and an adequate part to stabilize. This time period for the current pulse is typically about 2.2 seconds and the current density is typically, about 3333 Amperes ("A")/centimeters ("cm")$^2$ but may range from 1666 A/cm$^2$ to 5000 A/cm$^2$. The semiconductor device may then be measured during the current pulse to evaluate the electrical or optical performance characteristics as illustrated in blocks 40, 50, and 60 or the device may be allowed to rapidly cool and then measure these characteristics as illustrated in blocks 85, 90, and 100. Also, these characteristics may be measured both during and after the current pulse. If the performance characteristics are adequate, then the device is passed or accepted as illustrated in blocks 70 and 110. If the characteristics are inadequate, then the device fails and is rejected and marked with ink as illustrated in blocks 80 and 120. The devices tested were blue light emitting diodes formed of Silicon Carbide ("SIC"). The method may be used for various other semiconductor devices including green light emitting diodes formed of SiC.

Figure 2A:
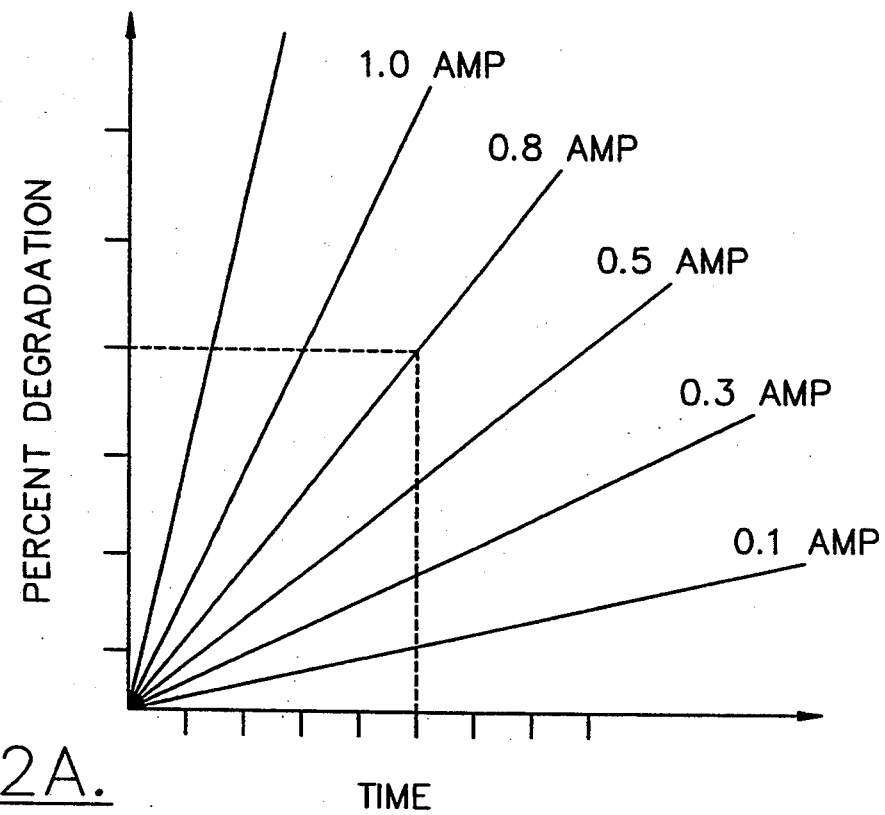
FIGS. 2A and 2B graphically illustrate the degradation of a semiconductor device over time by application of various current pulse levels according to the present invention.
Figure 2B:
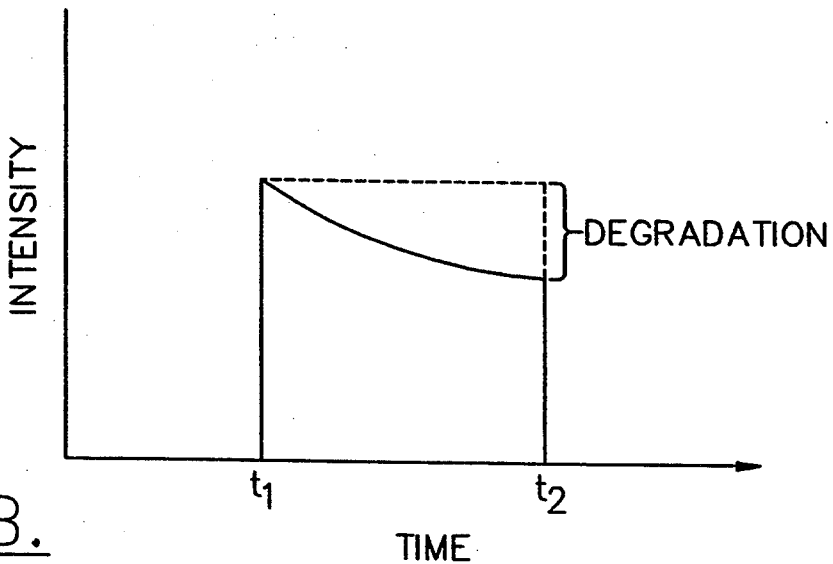

As graphically illustrated in FIG. 2A, when the level or amount of current applied to the device in block 30 of FIG. 1 increases for shorter durations, the less device degradation occurs. Hence, the relationship between a certain level of current to cause adequate devices, such as LED die, to stabilize and be accepted and to cause inadequate devices to degrade and be rejected is generally depicted by the graph. The current density may vary depending on the device under test, but typically about 3333 A/cm$^2$ for SiC devices is an acceptable level to cause the degradation in the inadequate LED devices. FIG. 2B graphically illustrates the degradation in radiation or light intensity which occurs in an inadequate device when pulsed with a high level of current (i.e., 3333 A/cm$^2$).

It is well known to those skilled in the art to test semiconductor devices using a wafer prober. According to the method of the present invention, the wafer prober may be used to pulse individual LEDS on a wafer of semiconductor material, such as SiC, and measure the performance characteristics of the devices thereon.

With LEDs, for example, light intensity, color, and color degradation could be measured by this technique as well as $V_F$ and reverse current ($I_R$) or the like. In general, the measurements for LEDs and other semiconductor devices may include one or more of the following: forward voltage, reverse voltage, forward current, reverse current, hue, hue degradation, light output power, light output power degradation, luminous intensity, luminous intensity degradation, luminous efficacy, color, color degradation, peak color wavelength, dominant color wavelength, speed of response, capacitance, thermal resistance, power dissipation, and combinations thereof. These measurements, however, are not limited to these particular device characteristics.

Also, from these measurements and various computer software programs, the entire performance of semiconductor devices such as LEDs may be calculated and mapped for a wafer of such devices. The mapping may include graphs of electrical or optical performance characteristics over time and positional location of unacceptable and acceptable devices on a semiconductor wafer. This type of mapping information provides feedback to the manufacturer on semiconductor material quality, material processing techniques, and various other information about the devices under test.

Figure 3:
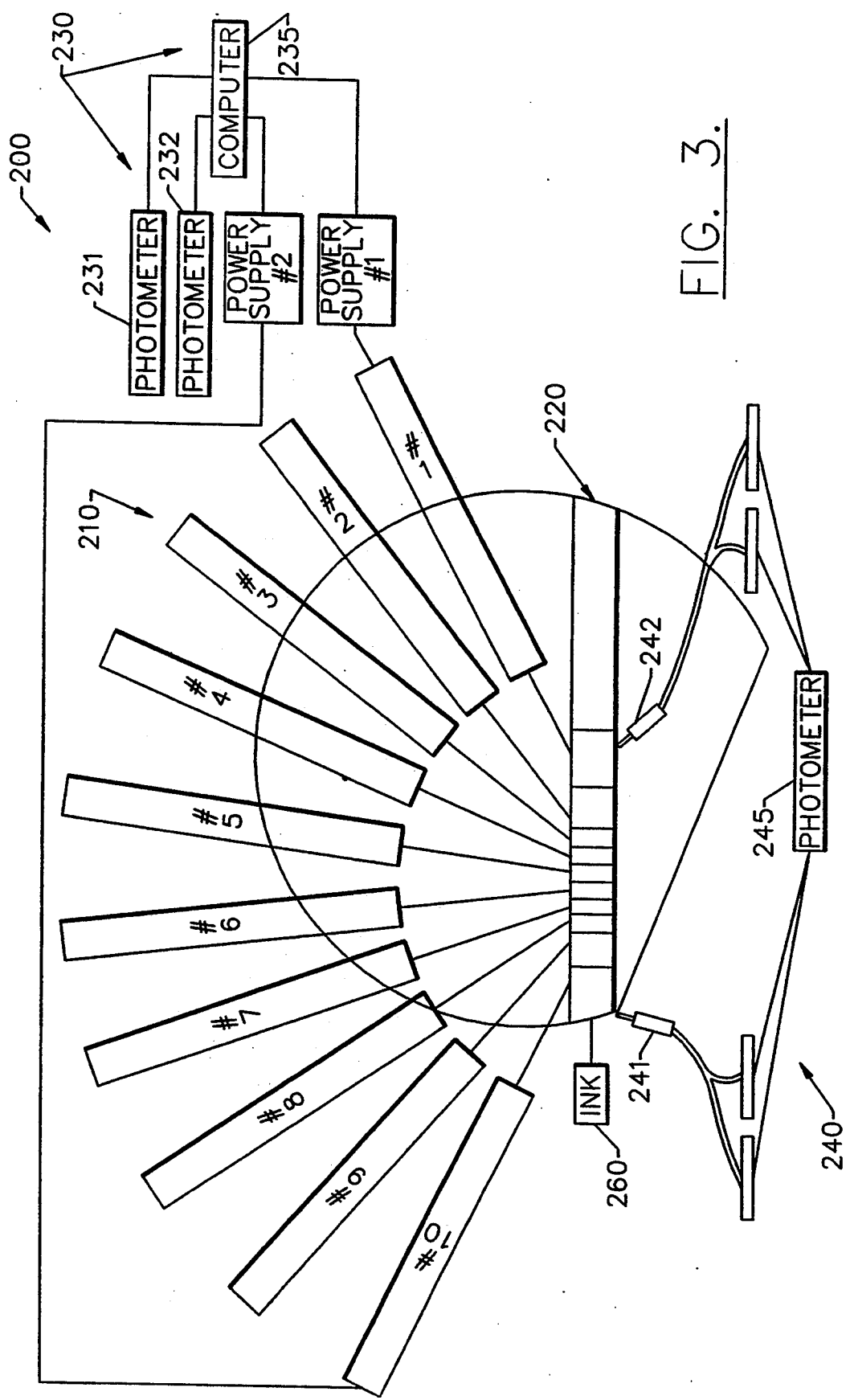
FIG. 3 is a schematic diagram of a system for testing a wafer of semiconductor devices, such as LEDs, according to the present invention.

FIG. 3 schematically illustrates an apparatus for testing a wafer of semiconductor devices, such as LEDs. At least one of the ten contact probes, shown respectively at 210, applies a current pulse to the LEDs on the wafer according to the method described in FIG. 1. The current density of the current pulse is relatively high and is typically about 3333 A/cm$^2$. A measuring means 230 is electrically connected to the contact probe 210 for measuring predetermined electrical performance characteristics of the semiconductor devices on the wafer. The measuring means 230 has three photometers 231, 232, 245 and a computer 235 to perform measurements during testing. An optical detection means 240, such as fiber optic probes 241, 242 or sensors, is electrically connected to the measuring means 230 for detecting radiation and color hue, ranges of blue and green, emitted from the LED devices on the wafer. The color hue measurement may be passed through a blue pass and a green pass filter to measure and detect the ratio of color hues on each individual device. Unacceptable devices on the wafer are marked using the ink well 260.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method of testing semiconductor device, comprising the steps of:
   pulsing a semiconductor device being tested with a predetermined level of current higher than the average operational current level of the semiconductor device being tested for a duration of time of less than 15 seconds so as to cause an inadequate device being tested to degrade and to cause an adequate device being tested to stabilize; and
   measuring predetermined electrical or optical performance characteristics for the semiconductor device after the current pulse.

2. A method of testing a semiconductor device according to claim 1, further comprising the step of initially measuring predetermined electrical or optical performance characteristics of a semiconductor device being tested prior to the step of pulsing the semiconductor device with a predetermined level of current.

3. A method of testing a semiconductor device according to claim 1, wherein the step of measuring predetermined electrical or optical performance characteristics of the semiconductor device is also performed during the step of pulsing the device with current.

4. A method of testing a semiconductor device according to claim 2, further comprising the step of terminating the testing of the semiconductor device if it fails to meet the predetermined electrical performance optical characteristics before the current pulse.

5. A method of testing a semiconductor device according to claim 2, wherein the step of initially measuring the predetermined electrical or optical performance characteristics of the semiconductor device includes measuring performance characteristics selected from the group consisting of: forward voltage, reverse voltage, forward current, reverse current, hue, hue degradation, light output power, light output power degradation, luminous intensity, luminous intensity degradation, luminous efficacy, color, color degradation, peak color wavelength, dominant color wavelength, speed of response, capacitance, thermal resistance, power dissipation, and combinations thereof.

6. A method of testing a semiconductor device according to claim 1, wherein the predetermined current density of the current pulse ranges from 1666 A/cm$^2$ to 5000 A/cm$^2$.

7. A method of testing a semiconductor device according to claim 1, wherein the predetermined current density of the current pulse is about 3333 A/cm$^2$.

8. A method of testing a semiconductor device according to claim 1, wherein the semiconductor device is formed of silicon carbide.

9. A method of testing a semiconductor device according to claim 1, wherein the semiconductor device is a blue light emitting diode formed of silicon carbide.

10. A method of testing a semiconductor device according to claim 1, wherein the semiconductor device being tested comprises an optoelectronic device.

11. A method of testing a light emitting diode comprising the steps of:
    pulsing a light emitting diode being tested with a predetermined level of current higher than the average operational current level of the light emitting diode being tested for a duration of time of less than 15 seconds so as to cause an inadequate light emitting diode to degrade and to cause an adequate light emitting diode to stabilize; and
    measuring predetermined electrical or optical performance characteristics for the light emitting diode after the current pulse.

12. A method of testing a light emitting diode according to claim 11, further comprising the step of initially measuring predetermined electrical or optical performance characteristics of a light emitting diode prior to the step of pulsing the light emitting diode with a predetermined level of current.

13. A method of testing a light emitting diode according to claim 11, wherein the measuring predetermined electrical or optical performance characteristics step is also performed during the current pulse.

14. A method of testing a light emitting diode according to claim 12, wherein the initially measuring step is preceded by the step of mounting a wafer of light emitting diodes onto a probing machine for individually measuring the electrical or optical performance characteristics of each light emitting diode on the wafer.

15. A method of testing a light emitting diode according to claim 14, wherein the mounting step is followed by the step of contacting the light emitting diode with a measuring probe.

16. A method of testing a light emitting diode according to claim 12, wherein the initially measuring step is followed by the step of terminating the testing of the light emitting diode on the wafer if it fails to meet the predetermined electrical or optical performance characteristics, and prior to the step of pulsing the light emitting diode with a relatively high predetermined level of current.

17. A method of testing a light emitting diode according to claim 13, further comprising the step of marking the light emitting diode on the wafer with ink if it fails to meet the predetermined electrical optical performance characteristics measured during the current pulse.

18. A method of testing a light emitting diode according to claim 12, wherein the step of initially measuring the predetermined electrical or optical performance characteristics of the emitting diode being tested includes measuring performance characteristics selected from the group consisting of: forward voltage, reverse voltage, forward current, reverse current, hue, hue degradation, light output power, light output power degradation, luminous intensity, luminous intensity degradation, luminous efficacy, color, color degradation, peak color wavelength, dominant color wavelength, speed of response, capacitance, thermal resistance, power dissipation, and combinations thereof.

19. A method of testing a light emitting diode according to claim 11, wherein the light emitting diode is formed of silicon carbide.

20. A method of testing a light emitting diode according to claim 11, wherein the light emitting is a blue light emitting diode formed of silicon carbide.

21. A method of testing a light emitting diode according to claim 11, wherein the predetermined current density of the current pulse ranges from 1666 A/cm$^2$ to 5000 A/cm$^2$.

22. A method of testing a light emitting diode according to claim 11, wherein the predetermined current density of the current pulse is about 3333 A/cm$^2$.

23. A method of testing a light emitting diode according to claim 11, further comprising the step of mapping the electrical or optical performance characteristics for the light emitting diodes under test.

24. A method of testing a wafer of light emitting diodes, comprising the steps of:
  pulsing each light emitting diode on a wafer being tested with a predetermined level of current higher than the average operational current for the light emitting diode being tested for a duration of time of less than 15 seconds so as to cause inadequate light emitting diodes being tested to degrade and to cause adequate light emitting diodes being tested to stabilize; and
  measuring predetermined electrical or optical performance characteristics for each light emitting diode after the current pulse.

25. A method of testing a wafer of light emitting diodes according to claim 24, further comprising the step of initially measuring predetermined electrical or optical performance characteristics of each individual light emitting diode on a wafer prior to the step of pulsing each light emitting with a predetermined level of current.

26. A method of testing a wafer of light emitting diodes according to claim 24, wherein the measuring predetermined electrical or optical performance characteristics step is also performed during the current pulse.

27. A method of testing a wafer of light emitting diodes according to claim 25, wherein the initially measuring step is preceded by the step of mounting a wafer of light emitting diodes onto a probing machine for individually measuring the electrical or optical performance characteristics of each light emitting diode on the wafer.

28. A method of testing a wafer of light emitting diodes according to claim 27, wherein the mounting step is followed by the step of contacting each individual light emitting diode with a measuring probe.

29. A method of testing a wafer of light emitting diodes according to claim 25, wherein the initially measuring step is followed by the step of terminating the testing of the light emitting diodes on the wafer failing to meet the predetermined electrical or optical performance characteristics, and prior to the step of pulsing each light emitting diode on the wafer with a predetermined level of current.

30. A method of testing a wafer of light emitting diode according to claim 29, further comprising the step of marking the light emitting diodes on the wafer with ink which fail meet the predetermined electrical or optical performance characteristics measured during the current pulse.

31. A method of testing a wafer of light emitting diodes according to claim 24, wherein the step of initially measuring predetermined electrical or optical performance characteristics of a wafer of light emitting diodes being tested includes measuring performance characteristics selected from the group consisting of: forward voltage, reverse voltage, forward current, reverse current, hue, hue degradation, light output power, light output power degradation, luminous intensity, luminous intensity degradation, luminous efficacy, color, color degradation, peak color wavelength, dominant color wavelength, speed of response, capacitance, thermal resistance, and power dissipation, and combinations thereof.

32. A method of testing a wafer of light emitting diodes according to claim 24, wherein the predetermined current density of the current pulse ranges from 1666 A/cm$^2$ to 5000 A/cm$^2$.

33. A method of testing a wafer of light emitting diodes according to claim 24, wherein the predetermined current density of the current pulse is about 3333 A/cm$^2$.

34. A method of testing a wafer of light emitting diodes according to claim 24, wherein the wafer of light emitting diodes is formed of silicon carbide.

35. A method of testing a wafer of light emitting diodes according to claim 24, wherein the light emitting diodes of the wafer are blue light emitting diodes formed of silicon carbide.

36. A method of testing a wafer of light emitting diodes according to claim 24, further comprising the step of mapping the electrical or optical performance characteristics of the light emitting diodes for the wafer under test.

37. A system for testing a wafer of optoelectronic semiconductor devices prior to packaging, comprising:
  a plurality of contact probes adapted for applying a pulse of a predetermined level of current higher than the average operational current level to a plurality of optoelectronic semiconductor devices on a wafer being tested for a period of time of less than 15 seconds to thereby degrade an inadequate device being tested and to stabilize an adequate device being tested;
  measuring means electrically connected to said plurality of contact probes for measuring predetermined electrical or optical performance characteristics of the semiconductor device on the wafer being tested; and
  optical detection means electrically connected to said measuring means for detecting radiation emitted from the optoelectronic semiconductor devices on the wafer being tested and thereby determined whether the optoelectronic semiconductor device has degraded after the current pulse.

38. A system for testing a semiconductor device on a wafer according to claim 37, wherein said measuring means comprises a photometer and a computing device.

39. A system for testing a semiconductor device on a wafer according to claim 37, wherein said optical detection means comprises a fiber optic probe.

* * * * *

UNITED STATES PATENT AND TRADEMARK OFFICE
CERTIFICATE OF CORRECTION

PATENT NO. : 5,381,103

DATED : January 10, 1995

INVENTOR(S) : Edmond et al.

It is certified that error appears in the above-indentified patent and that said Letters Patent is hereby corrected as shown below:

Column 4, line 8, after "typically" delete ",".

Column 5, line 35, after "testing" insert --a--.

Column 5, line 61, after "electrical" insert --or optical--.

Column 5, line 61, after "performance" delete "opti-".

Column 5, line 62, delete "cal".

Column 6, line 68, after "electrical" insert --or--.

Column 7, line 51, after "emitting" insert --diode--.

UNITED STATES PATENT AND TRADEMARK OFFICE
CERTIFICATE OF CORRECTION

PATENT NO. : 5,381,103

DATED : January 10, 1995

INVENTOR(S) : Edmond et al

It is certified that error appears in the above-indentified patent and that said Letters Patent is hereby corrected as shown below:

Column 7, line 59, "initially" should be --initial--.

Column 8, line 2, "initially" should be --initial--.

Column 8, line 12, after "fail" insert --to--.

Signed and Sealed this

Second Day of May, 1995

Attest:

BRUCE LEHMAN

Attesting Officer        Commissioner of Patents and Trademarks